(12) United States Patent
Kobayashi et al.

(10) Patent No.: US 7,180,182 B2
(45) Date of Patent: Feb. 20, 2007

(54) SEMICONDUCTOR COMPONENT

(75) Inventors: Tsuyoshi Kobayashi, Nagano (JP);
Shigetsugu Muramatsu, Nagano (JP);
Takuya Kazama, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 236 days.

(21) Appl. No.: 10/492,556

(22) PCT Filed: Oct. 11, 2002

(86) PCT No.: PCT/JP02/10611

§ 371 (c)(1),
(2), (4) Date: Apr. 14, 2004

(87) PCT Pub. No.: WO03/034491

PCT Pub. Date: Apr. 24, 2003

(65) Prior Publication Data

US 2004/0238951 A1 Dec. 2, 2004

(30) Foreign Application Priority Data

Oct. 16, 2001 (JP) .............................. 2001-317541

(51) Int. Cl.
*H01L 23/48* (2006.01)
(52) U.S. Cl. .................... 257/734; 257/737; 257/738
(58) Field of Classification Search ................ 257/734, 257/737, 738
See application file for complete search history.

(56) References Cited

U.S. PATENT DOCUMENTS

| | | | |
|---|---|---|---|
| 5,834,849 A | 11/1998 | Lane | |
| 5,986,294 A | 11/1999 | Miki et al. | |
| 6,098,278 A | 8/2000 | Vindasius et al. | |
| 6,150,727 A * | 11/2000 | Takagi | 257/786 |
| 6,236,112 B1 * | 5/2001 | Horiuchi et al. | 257/734 |
| 2004/0238951 A1 * | 12/2004 | Kobayashi et al. | 257/734 |

FOREIGN PATENT DOCUMENTS

| | | |
|---|---|---|
| EP | 0 907 207 A2 | 4/1999 |
| EP | 907207 A2 * | 4/1999 |
| JP | 5-29377 | 2/1993 |
| WO | WO 3034491 A2 * | 4/2003 |

* cited by examiner

*Primary Examiner*—Laura M. Schillinger
(74) *Attorney, Agent, or Firm*—Staas & Halsey LLP

(57) ABSTRACT

A semiconductor component having electrode terminals 14 formed in rectangular planar shapes arranged in parallel on an electrode forming surface of a semiconductor chip and formed with rerouting patterns 16 electrically connected with the electrode terminals 14 through vias on the surface of an electrical insulating layer covering the electrode forming surface, characterized in that the planar arrangement of the via pads 20 formed on the surface of the electrical insulating layer is made an arrangement alternately offset to one side and the other side of the longitudinal direction of the electrode terminals 14 and in that rerouting patterns 16 are provided connected to the via pads 20. The present invention enables easy formation of rerouting patterns even when the electrode terminals are arranged at fine intervals.

7 Claims, 3 Drawing Sheets

SEMICONDUCTOR COMPONENT

TECHNICAL FIELD

The present invention relates to a semiconductor component characterized by the provision of rerouting patterns at a semiconductor chip where electrode terminals are arranged at fine intervals.

BACKGROUND ART

Wafer level packages are semiconductor components obtained by processing the surface of a wafer at the semiconductor wafer stage to form rerouting patterns. After performing predetermined processing at the wafer level, they are divided into the individual pieces. These semiconductor components are then either mounted on mother boards or stacked in a chip-on-chip configuration.

When producing such semiconductor components, the individual chips formed on the semiconductor wafer are formed with interconnects (called "rerouting") from their electrode terminals to predetermined positions where external electrodes are formed or else the interconnects are connected by wire bonding for mounting on a mother board etc.

FIG. 6 is a view of the state where the surface of a semiconductor wafer 10 is provided with an electrical insulating layer 12 and the surface of the insulating layer 12 is formed with a rerouting pattern 16 electrically connected to an electrode terminal 14 through a via 15. The rerouting pattern is for example electrically connected at one end with the electrode terminal 14 and formed at the other end with a land portion for bonding with an external connection terminal or a bonding portion for wire bonding. Rerouting patterns 16 can be formed into any pattern on the surface of the insulating layer 12, so the rerouting patterns 16 are suitably led out from the electrode terminals 14 to arrange land portions or bonding portions.

FIG. 5 shows an example of conventional formation of rerouting patterns. It shows a plan arrangement of connecting portions between electrode terminals 14 and rerouting patterns 16. The electrode terminals 14 are formed in square shapes at constant intervals on the surface of the semiconductor wafer 10. Via holes 18 are formed in the plane of the electrode terminals 14, while conductor layers at the inside of the via holes 18 are formed as vias. Via pads 20 are formed with certain widths at the peripheral rims of the via holes 18. These are to ensure the electrical connection between the rerouting patterns 16 and the vias.

Recent semiconductor chips, however, are becoming smaller in size and increased in number of terminals, so the problem has been arising that the interval of arrangement between the electrode terminals 14 has become narrower and sufficient space S between adjoining via pads 20 can no longer be obtained. In the example shown in FIG. 5, the diameter dimension R of the via pads 20 is set larger than the width dimension of the electrode terminals 14, but when the interval of arrangement between electrode terminals 14 becomes narrower, it is possible to secure the interval of arrangement between via pads 20 by making the via holes 18 smaller and reducing the diameter dimension R of the via pads 20. Forming the via holes 18 smaller, however, gives rise to problems in the processing accuracy and the problem of a higher contact resistance. Further, if the via pads 20 are made smaller, there is the problem that the reliability of the electrical connection with the rerouting patterns 16 becomes lower.

Further, when providing bonding portions at the rerouting patterns and connecting with a mother board or other semiconductor chip by wire bonding, it becomes necessary to provide the bonding portions near the electrode terminals of the semiconductor chip. In this case, there is the problem that it is difficult to secure sufficient bonding portions near the electrode terminals when the interval of arrangement of the electrode terminals of the semiconductor chip is narrow.

DISCLOSURE OF THE INVENTION

The object of the present invention is to provide a semiconductor component enabling the easy and reliable formation of rerouting patterns without reducing the diameter of the via pads or narrowing of the rerouting widths even when electrode terminals are arranged at fine intervals, enabling bonding portions to be secured near the electrode terminals, and enabling connection by wire bonding to be easily handled.

To achieve the above object, the present invention is configured as follows:

That is, there is provided a semiconductor component having electrode terminals formed in rectangular planar shapes arranged in parallel on an electrode forming surface of a semiconductor chip and formed with rerouting patterns electrically connected with said electrode terminals through vias on the surface of an electrical insulating layer covering the electrode forming surface, characterized in that the planar arrangement of the via pads formed on the surface of the electrical insulating layer is made an arrangement alternately offset to one side and the other side of the longitudinal direction of the electrode terminals and in that the rerouting patterns are provided connected to the via pads.

Further, the component is characterized in that bonding portions obtained by forming the rerouting patterns wider and to be connected by wire bonding are provided at portions near via pads of said rerouting patterns.

Further, the component is characterized in that said bonding portions are provided by being led out from the via pads on to regions of the adjoining electrode terminals.

Further, there is provided a semiconductor component formed on the surface of an electrical insulating layer covering an electrode terminal forming surface of a semiconductor chip with rerouting patterns electrically connected with electrode terminals through vias, characterized in that bonding portions obtained by forming the rerouting patterns wider and to be connected by wire bonding are provided at portions near via pads of said rerouting patterns.

Further, the component is characterized in that said bonding portions are provided at positions not interfering with each other at portions near said via pads.

BEST MODE FOR WORKING THE INVENTION

Next, preferred embodiments of the present invention will be described in detail with reference to the attached drawings.

Figure 1:
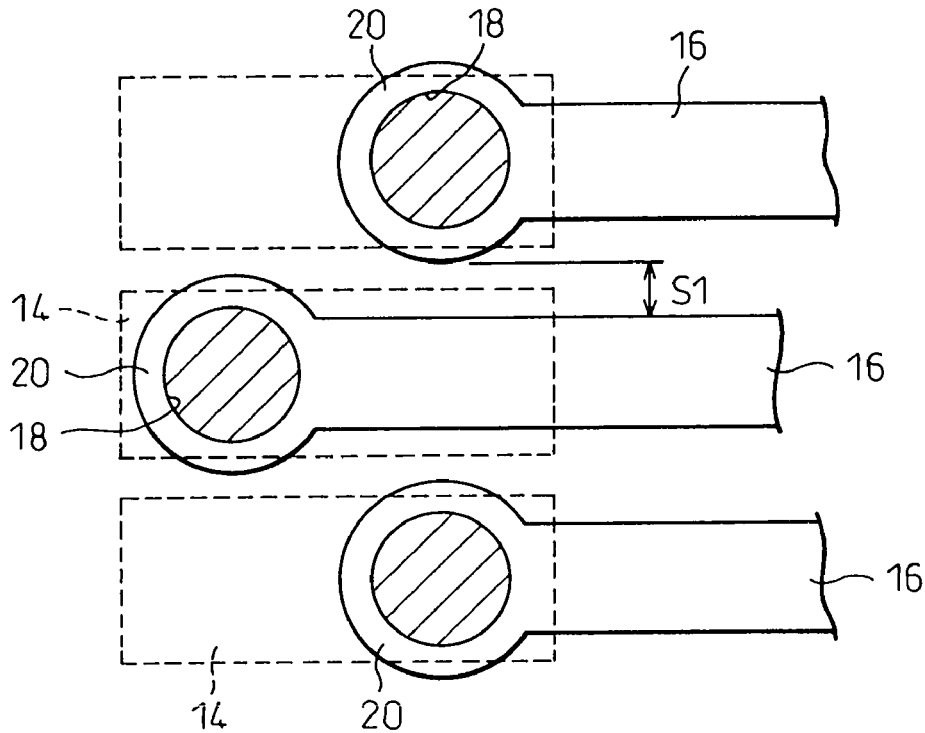
FIG. 1 shows the planar arrangement of via pads and electrode terminals formed on rerouting patterns.

FIG. 1 is an explanatory view of an example of formation of rerouting patterns in a semiconductor component according to the present invention. In the figure, 14 shows electrode terminals formed on a wafer, while 16 shows rerouting patterns electrically connected to the electrode terminals 14. The characterizing feature in the semiconductor component of the present embodiment is that via pads 20 arranged electrically connected to the electrode terminals 14 formed in rectangular planar shapes and arranged in parallel are arranged offset to one side and the other side in the longitudinal direction of the electrode terminals 14.

If the semiconductor chip is made smaller and the interval of arrangement of the electrode terminals 14 becomes narrower, the bonding areas of the electrode terminals become smaller, so the electrode terminals 14 are formed into long, narrow rectangular shapes to secure the bonding areas. In the semiconductor component of the present embodiment, provision is made of a semiconductor chip formed with electrode terminals 14 formed into such rectangular shapes characterized in that the via pads 20 are arranged in a zig-zag form so as to secure the space between adjoining via pads 20 and enable rerouting without reducing the diameter of the via pads 20 or reducing the width dimensions of the rerouting patterns 16 even when the interval of arrangement between electrode terminals 14 becomes narrower.

Figure 6:
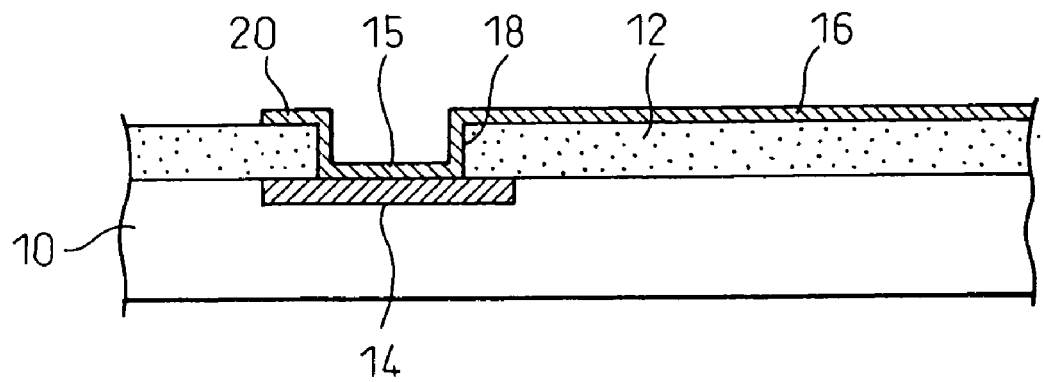
FIG. 6 is a sectional view of the configuration of a rerouting pattern.

Note that the method of forming rerouting patterns 16 electrically connected to the electrode terminals 14 is similar to the conventional method of forming rerouting patterns 16 shown in FIG. 6. That is, an electrical insulating layer 12 is formed on the surface of a semiconductor wafer 10, then via holes 18 are formed matched with the positions of arrangement of the electrode terminals 14 and the inside walls of the via holes 18 and the surface of the insulating layer 12 are plated to form a conductor layer and form rerouting patterns 16. In the present embodiment, since the via pads 20 are arranged in a zig-zag configuration, when forming via holes 18 in the insulating layer 12, the via holes 18 are formed alternately at positions offset to one side and the other side of the longitudinal direction of the electrode terminals 14.

After forming the via holes 18, the inside walls of the via holes 18 and the surface of the insulating layer 12 are formed with a plating seed layer by sputtering. Next, the surface of the plating seed layer is covered by a photosensitive resist, then the photosensitive resist is exposed and developed to form a resist pattern exposing the portions for forming the rerouting patterns 16 and via pads 20. Next, copper is electrolytically plated using the plating seed layer as a plating power layer to form conductor layers at the exposed portions of the plating seed layer, then the resist pattern is dissolved and removed, and the exposed portions of the plating seed layer are etched away to form rerouting patterns 16 electrically connected to the electrode terminals 14 by the vias.

Note that the procedure for forming the rerouting patterns 16 is performed for the entire electrode forming surface of the semiconductor wafer. An actual semiconductor wafer is formed with a large number of individual semiconductor chips arranged connected in the vertical and horizontal directions, so rerouting patterns 16 are formed in a predetermined pattern corresponding to the arrangement of these semiconductor chips.

Further, after forming the rerouting patterns 16, the semiconductor wafer can be divided into the individual pieces so as to obtain the individual semiconductor chips formed with the rerouting patterns 16.

Normally, the diameter of the via pads 20 becomes larger than the width of the rerouting patterns 16. Therefore, as shown in FIG. 1, if arranging the positions for arrangement of the via pads 20 in the planar regions where the electrode terminals 14 are formed alternately offset to one side and the other side for each electrode terminal, the arrangement where the via pads 20 formed at adjoining electrode terminals 14 overlap each other can be eliminated and extra space can be secured between adjoining via pads 20. Therefore, it is possible to secure sufficient space between the via pads 20 and rerouting patterns 16 even if the via pads 20 and the rerouting patterns 16 are arranged adjoining each other. Due to this, even when the interval of arrangement of the electrode terminals 14 becomes narrower, it becomes possible to easily form the rerouting patterns 16 without reducing the diameter dimension of the via pads 20.

With a conventional method of forming rerouting patterns, if the width dimension of the electrode terminals 14 is 80 μm and the interval of arrangement between electrode terminals 14 is 10 μm, that is, the pitch of the electrode terminals 14 is 90 μm, if the diameter of the via pads is made 80 μm and the width of the rerouting patterns is made 50 μm, the interval between via pads becomes 10 μm, but according to the method of the present invention, it is possible to secure an interval of 25 μm as the interval between the via pads and adjoining rerouting patterns (S1 in FIG. 1).

Figure 2:
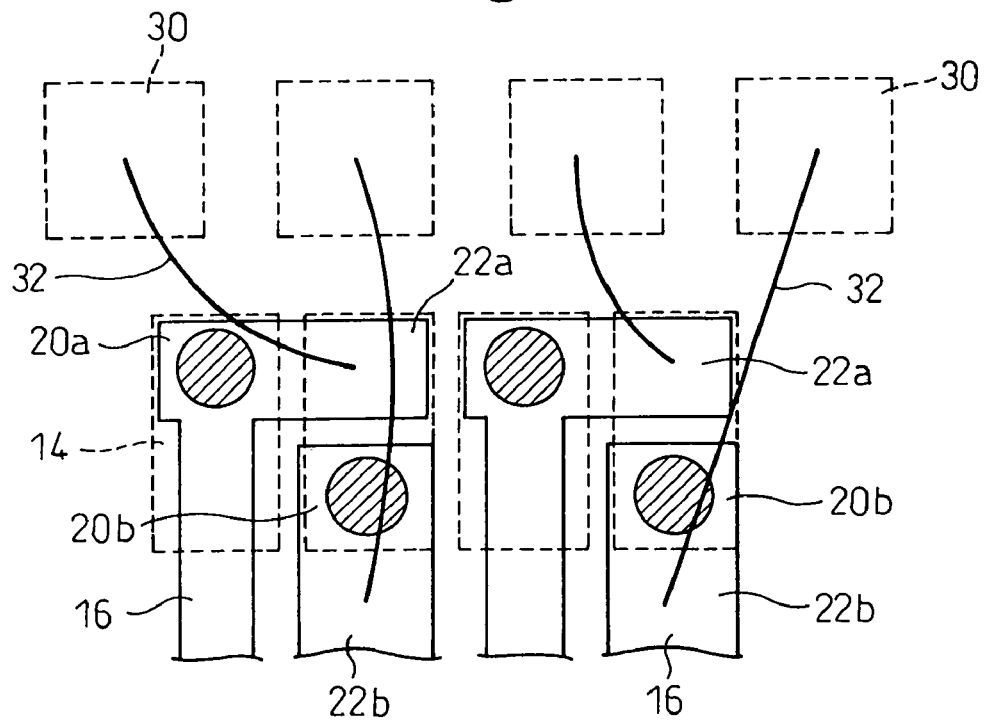
FIG. 2 shows the planar arrangement of rerouting patterns and bonding portions.

Note that in the embodiment shown in FIG. 1, the rerouting patterns 16 are led out straight from the electrode terminals 14, but by arranging the via pads 20 offset in the planar regions of the electrode terminals 14, as shown in FIG. 2, it is possible to form bonding portions for wire bonding at the rerouting patterns 16.

The arrangement of the rerouting patterns 16 shown in FIG. 2 is characterized by, for the via pad 20a arranged at one side of the electrode terminal (front end side), forming the rerouting pattern 16 by leading it out from the via pad 20a and forming the bonding portion 22a by extending it directly from the via pad 20a at the space portion above the adjoining electrode terminal 14 from the via pad 20a and by, for the via pad 20b arranged at the other side of the electrode terminal 14 (rear end side), forming the broad bonding portion 22b directly from the via pad 20b at the pattern led out from the via pad 20b.

The bonding portions 22a and 22b formed at the rerouting patterns 16 become the portions bonded by bonding wires when electrically connecting the rerouting patterns 16 with another semiconductor chip or a mother board (package) by wire bonding. FIG. 2 shows an example of connecting the electrode terminals 30 of another semiconductor chip or mother board (package) with the bonding portions 22a and 22b by bonding wires 32.

If arranging the via pads in the planar regions of the electrode terminals 14 offset to one side and the other side as in this embodiment, it is possible to effectively use the surface space of the insulating layer 12 to form the bonding portions 22a and 22b.

Figure 3A:
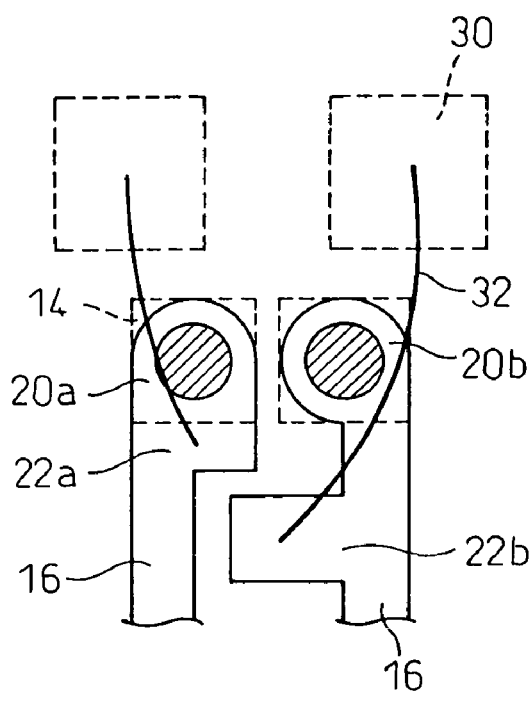
FIGS. 3A and 3B show other examples of the planar arrangement of rerouting patterns and bonding portions.
Figure 3B:
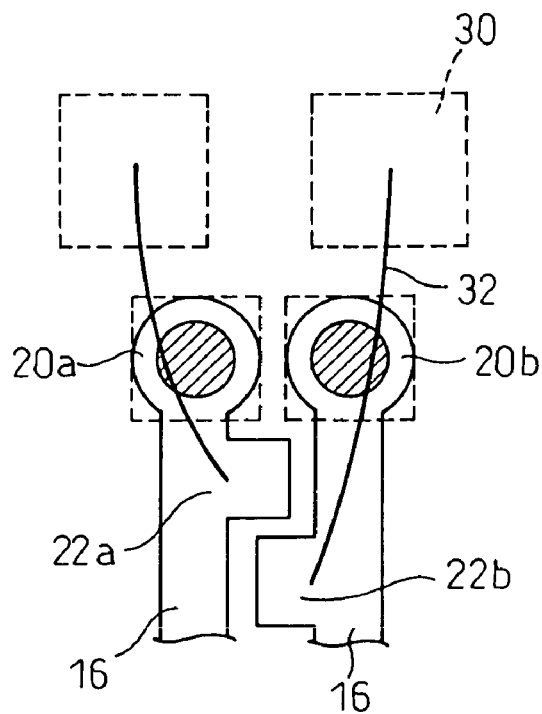

Note that according to the present invention, the method of forming the bonding portions used for connection of the rerouting patterns by wire bonding can also be applied to the case of arranging the via pads serially in the same way as in the past. FIGS. 3A and 3B show cases of forming bonding portions 22 at rerouting patterns 16 in the case of the conventional arrangement of via pads. In FIG. 3A, for one via pad 20a, the broad bonding portion 22a is extended directly from the via pad 20a at the rear end side and the narrow rerouting pattern 16 is led out from the bonding portion 22a, while for the other via pad 20b, the bonding portion 22b is extended toward the facing rerouting pattern 16 at a position not interfering with the bonding portion 22a and a narrow rerouting pattern 16 is led out from the bonding portion 22b.

Further, in the embodiment shown in FIG. 3B, for the via pad 20a, the bonding portion 22a is formed extending from the side edge of the rerouting pattern toward the facing via pad 20b at a position near the via pad 20a, while for the via pad 20b, the bonding portion 22b is formed extending from the rerouting pattern led out from the via pad 20 toward the facing rerouting pattern at a position where interference with the bonding portion 22b does not occur.

The embodiments shown in FIGS. 3A and 3B form the portions near the via pads 20a and 20b broadly to form the bonding pads 22a and 22b. In particular, by selecting positions where the bonding portions 22a and 22b do not interfere near the via pads 20a and 20b, it is possible to secure the required bonding regions and reliably wire bond the rerouting patterns.

Figure 4:
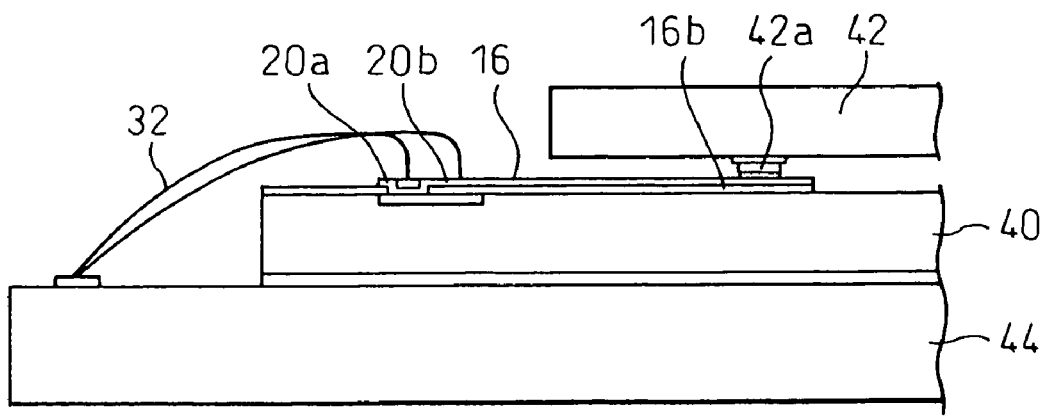
FIG. 4 shows an example of mounting a semiconductor chip formed with rerouting patterns.
Figure 5:
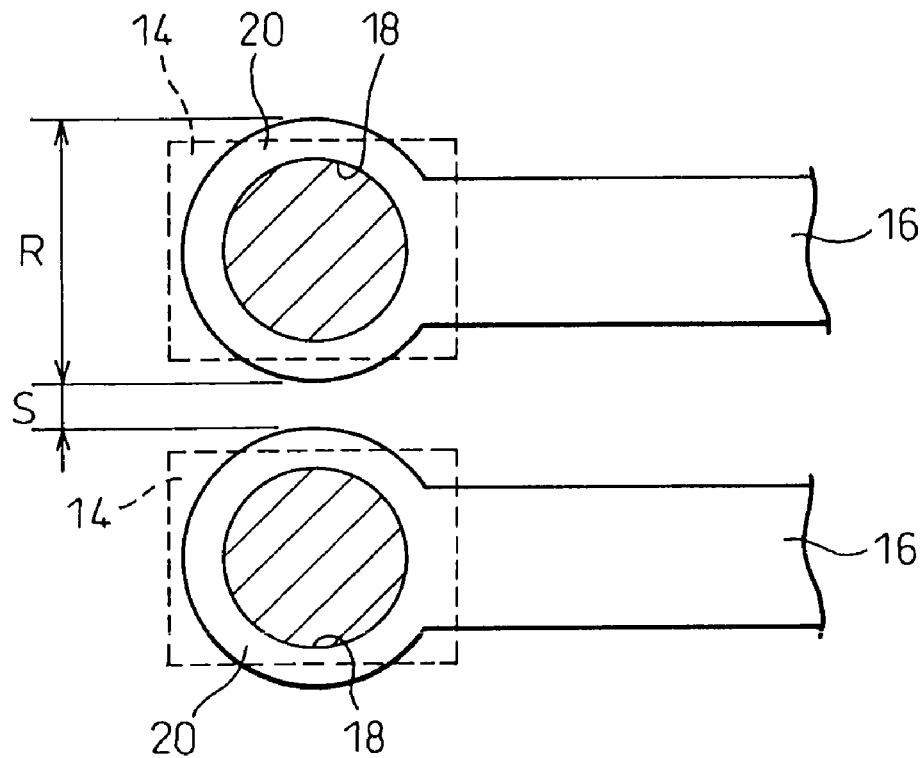
FIG. 5 shows the planar arrangement of electrode terminals and rerouting patterns of the prior art.

FIG. 4 shows an example of mounting a semiconductor component 40 formed with rerouting patterns 16 having bonding portions 22a and 22b shown in FIG. 2. In this example, another semiconductor chip 42 is mounted on the semiconductor component 40 and the semiconductor component 40 is mounted on a mother board 44. The semiconductor chip 42 is electrically connected by flip-chip connection to the land portions 16b of the rerouting patterns 16 of the semiconductor component 40 through bumps 42a, while the semiconductor component 40 is electrically connected by wire bonding to the mother board 44.

Note that instead of the mother board 44, it is also possible to mount the semiconductor component 40 on another semiconductor chip. Further, instead of the mother board 44, it is possible to mount the semiconductor component 40 on another semiconductor package.

By providing the bonding portions 22a and 22b at the rerouting patterns 16 in this way, it is possible to electrically connect the semiconductor component with another semiconductor chip or a mother board or semiconductor package by wire bonding and possible to provide various types of electronic devices.

Note that the bonding portions formed near the via pads can be formed into a suitable pattern in accordance with the arrangement of the via pads and rerouting patterns. The arrangement of the rerouting patterns and bonding portions are not limited to the above embodiments.

INDUSTRIAL APPLICABILITY

According to the semiconductor component of the present invention, as explained above, it becomes possible to give a zig-zag planar arrangement of the via pads connected to the electrode terminals and effectively secure space for arranging the via pads and rerouting patterns and it becomes possible to easily form rerouting patterns even when electrode terminals are arranged at fine intervals. Further, by forming broad portions at the rerouting patterns to provide bonding portions, the remarkable effect is exhibited that it becomes possible to use them as portions for electrically connecting the rerouting patterns by wire bonding.

The invention claimed is:

1. A semiconductor component having electrode terminals formed in rectangular planar shapes arranged in line at constant intervals and in parallel on an electrode forming surface of a semiconductor chip and formed with rerouting patterns electrically connected with said electrode terminals through vias on the surface of an electrical insulating layer covering the electrode forming surface, said semiconductor component characterized in that the planar arrangement of the via pads formed on the surface of the electrical insulating layer is made an arrangement within regions of corresponding electrode terminals and alternately offset to one side and the other side of the longitudinal direction of the electrode terminals and in that the rerouting patterns are provided connected to the via pads.

2. A semiconductor component as set forth in claim 1, characterized in that bonding portions obtained by forming the rerouting patterns wider and to be connected by wire bonding are provided at portions near via pads of said rerouting patterns.

3. A semiconductor component as set forth in claim 2, characterized in that said bonding portions are provided by being led out from the via pads on to regions of the adjoining electrode terminals.

4. A semiconductor component as set forth in claim 1, characterized in that another semiconductor chip is mounted to said semiconductor chip.

5. A semiconductor package characterized in that the semiconductor component set forth in claim 4 is mounted on any one of a mother board, another semiconductor chip, or another semiconductor package.

6. A semiconductor component as set forth in claim 2, characterized in that another semiconductor chip is mounted to said semiconductor chip.

7. A semiconductor component as set forth in claim 3, characterized in that another semiconductor chip is mounted to said semiconductor chip.

* * * * *